(12) United States Patent
Chen

(10) Patent No.: US 8,237,190 B2
(45) Date of Patent: Aug. 7, 2012

(54) IMAGE SENSOR PACKAGE AND IMAGE SENSING MODULE USING SAME

(75) Inventor: Ga-Lane Chen, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 284 days.

(21) Appl. No.: 12/633,888

(22) Filed: Dec. 9, 2009

(65) Prior Publication Data

US 2010/0314703 A1 Dec. 16, 2010

(30) Foreign Application Priority Data

Jun. 15, 2009 (CN) .......................... 2009 1 0303259

(51) Int. Cl.
*H01L 33/00* (2010.01)
(52) U.S. Cl. .......... 257/103; 257/98; 257/431; 257/432; 257/E51.04; 977/742; 977/842

(58) Field of Classification Search ................. 257/98, 257/103, 431, 432, E51.04; 977/742, 842
See application file for complete search history.

(56) References Cited

U.S. PATENT DOCUMENTS

| | | | |
|---|---|---|---|
| 2005/0285016 A1* | 12/2005 | Kong et al. | 250/208.1 |
| 2007/0165136 A1* | 7/2007 | Wu et al. | 348/373 |
| 2008/0055420 A1* | 3/2008 | Orihashi et al. | 348/208.4 |

* cited by examiner

*Primary Examiner* — Andy Huynh
(74) *Attorney, Agent, or Firm* — Altis Law Group, Inc.

(57) ABSTRACT

An exemplary image sensor package includes a base substrate, an image sensor, and a number of wires. The base substrate contains carbon nanotubes and alumina, and includes a number of base pads. The image sensor is mounted on the base substrate, and includes a sensing portion and a number of contacts. The wires electrically connect the base pads to the respective contacts.

18 Claims, 2 Drawing Sheets

IMAGE SENSOR PACKAGE AND IMAGE SENSING MODULE USING SAME

BACKGROUND

1. Technical Field

The disclose generally relates to image sensor package and image sensing modules, and particularly to a miniaturized image sensor package and a miniaturized image sensing module using the image sensor package.

2. Description of Related Art

In operation, a circuit board is used to provide electric current to an image sensor in a camera module of an electronic device. Heat generated by the image sensor can be transferred through the circuit board and then dissipated to the outside. However, base material of image sensors is usually silicon, and a coefficient of thermal expansion (CTE) of a typical circuit board, such as a fiberglass circuit board (FR4) is generally different from that of the image sensor. The difference of the thermal expansion between the image sensor and the circuit board may result in thermal stress and heat deformation between the image sensor and the circuit board when the image sensor generates heat.

In existing technology, a strength of the circuit board can be enhanced by increasing thickness thereof. With this configuration, the heat deformation of the circuit board can be diminished. However, dimensions of the portable electronic device equipped with such an image sensor and circuit board will necessarily be larger. In such case, the portable electronic device cannot meet needs of miniaturization.

Therefore, what is needed is an image sensor package and an image sensing module using the image sensor package that can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the various views.

DETAILED DESCRIPTION

Embodiments will now be described in detail below, with reference to the drawings.

Figure 1:
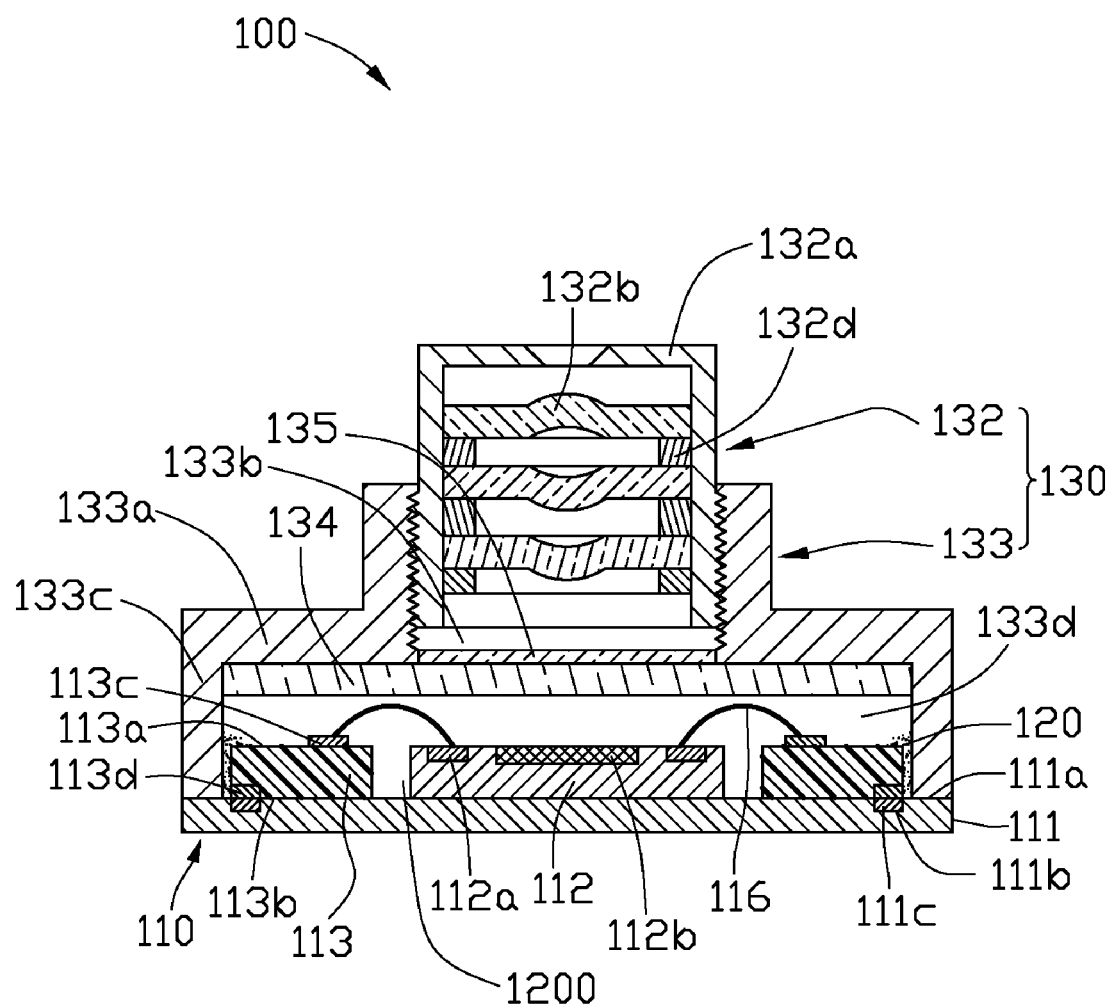
FIG. 1 is a cross section of an image sensing module according to a first embodiment.

Referring to FIG. 1, an image sensing module according to a first embodiment is shown. The image sensing module 100 includes an image sensor package 110 and a lens module 130. The lens module 130 includes a lens group 132 and a lens holder 133. The lens group 132 is mounted to the lens holder 133, and the lens holder 133 is mounted to the image sensor package 110 via an adhesive 120.

The image sensor package 110 includes a base substrate 111, an image sensor 112, a supporter 113, and a plurality of wires 116. The base substrate 111 includes a mounting surface 111a and a plurality of base pads 111c. The base pads 111c are formed on the mounting surface 111a. In particular, a plurality of recessed portions 111b can be defined in the mounting surface 111a of the base substrate 111. The base pads 111c thereby fill the recessed portions 111b, respectively. The base substrate 111 contains a mixture of carbon nanotubes (CNTs) and alumina. The CNTs account for about 0.5% to 10% of the total weight of the base substrate 111. In this embodiment, the CNTs account for 1% to 5% of the total weight of the base substrate 111. The base substrate 111 is a thin-type substrate, and has a thickness of less than 0.2 mm. In this embodiment, the thickness of the base substrate 111 is less than 0.15 mm. In addition, a dielectric constant of the base substrate 111 is in a range from 8 to 11. A thermal conductivity of the base substrate 111 is in a range from about 10 W/m° C. to about 40 W/m° C.

The supporter 113 includes a top surface 113a and a bottom surface 113b positioned on an opposite side from the top surface 113a. The supporter 113 is a frame-like structure. A through hole 1200 is defined in the top surface 113a of the supporter 113. Diameter of the through hole 1200 is larger than that of the image sensor 112. In addition, a plurality of top pads 113c is formed around the through hole 1200 on the top surface 113a. A plurality of bottom pads 113d is formed on a peripheral portion (not labeled) of the bottom surface 113b. In this embodiment, the bottom pads 113d are filled in a plurality of recessed portions (not labeled) defined in the bottom surface 113b of the supporter 113. The top pads 113c are protrusions extending out of the top surface 113a. The number of the top pads 113c is same as that of the bottom pads 113d. Each top pad 113c is electrically connected to a corresponding bottom pad 113d. The supporter 113 is mounted on the mounting surface 111a of the base substrate 111. Each bottom pad 113d of the supporter 113 is electrically connected to a base pad 111c of the base substrate 111 via surface mount technology (SMT), hot bar, or anisotropic conductive film (ACF).

In this embodiment, the image sensor 112 is mounted on the mounting surface 111a of the base substrate 111 and is received in the through hole 1200 of the supporter 113. In alternative embodiments, the supporter 113 need not have the through hole 1200 defined therein. In such case, the image sensor 112 can be mounted on the top surface 113a of the base substrate 111. The image sensor 112 can be a charge coupled device or a complementary metal-oxide-semiconductor. In a typical example, the image sensor 112 includes a sensing portion 112b, and a plurality of contacts 112a formed around the sensing portion 112b. The wires 116 electrically connect the contacts 112a to the top pads 113c of the supporter 113. Thereby the image sensor 112 is electrically connected to the base substrate 111 via the supporter 113.

The lens group 132 includes a barrel 132a, and at least one lens 132b. The barrel 132a is substantially a hollow cylinder. The at least one lens 132b is received in the barrel 132a. The at least one lens 132b may for example, include three lenses 132b arranged in sequence along a central axis (not labeled) of the barrel 132a. A spacer 132d may be further provided between each two neighboring lenses 132b. Thereby each two neighboring lenses 132b can be spaced from one another by one of the spacers 132d.

The lens holder 133 includes a top board 133a, a hole 133b defined in a central portion of the top board 133a, and a pedestal 133c. The pedestal 133c extends downwardly from a peripheral portion of the top board 133a. The top board 133a and the pedestal 133c cooperatively define a receiving space 133d. The receiving space 133d communicates with the hole 133b. A dimension of the receiving space 133d is larger than that of an outer periphery of the supporter 113, such that the supporter 113 is receivable in the receiving space 133d. In particular, the adhesive 120 is applied on the outer periphery of the supporter 113 and fixes the supporter 113 to the lens holder 133. The barrel 132a is received in the hole 133b. The lenses 132b in the barrel 132a each face the sensing portion 112b of the image sensor 112 to be able to form a focused image on the image sensor 112.

The lens module 130 may further include a light-pervious plate 134. The plate 134 is arranged between the barrel 132a (or the lens group 132) and the image sensor 112 for protecting the image sensor 112. In a typical application, the plate 134 is used to prevent the image sensor 112 from being contaminated by dust. Furthermore, a filter, such as an infrared-cut filter (IR-cut filter) sheet 135 may be stacked over/on the plate 134. In one example, the infrared-cut filter sheet 135 may be coated on the plate 134. The infrared-cut filter sheet 135 can be used to block transmission of infrared light to the image sensor 122.

One advantage of the image sensor package 110 is that the image sensor package 110 is equipped with a thin-type base substrate 111. Thus the image sensor package 110 has a small thickness, and dimensions of the image sensing module 100 are reduced. Another advantage yielded by the above-described image sensing module 100 is that the base substrate 111 provides relatively high strength and relatively high thermal conductivity. In one aspect, the base substrate 111 with relatively high strength has a relatively high Young's modulus. Thus the base substrate 111 supports the image sensor 112 and the lens module 130 steadily, and thereby deformation of the base substrate 111 can be avoided. In another aspect, the base substrate 111 with relatively high thermal conductivity facilitates transfer of heat from the image sensor 112 to the base substrate 111. Thus heat from the image sensor 112 can be dissipated to outside efficiently. Yet another advantage is, a CTE of the base substrate 111 is near to that of the image sensor 112, and thermal stress and/or thermal strain between the image sensor 112 and the base substrate 111 is relatively small. Thus, heat deformation between the image sensor 112 and the base substrate 111 when the heat generated by the image sensor is transferred to the base substrate 111 can be avoided.

Figure 2:
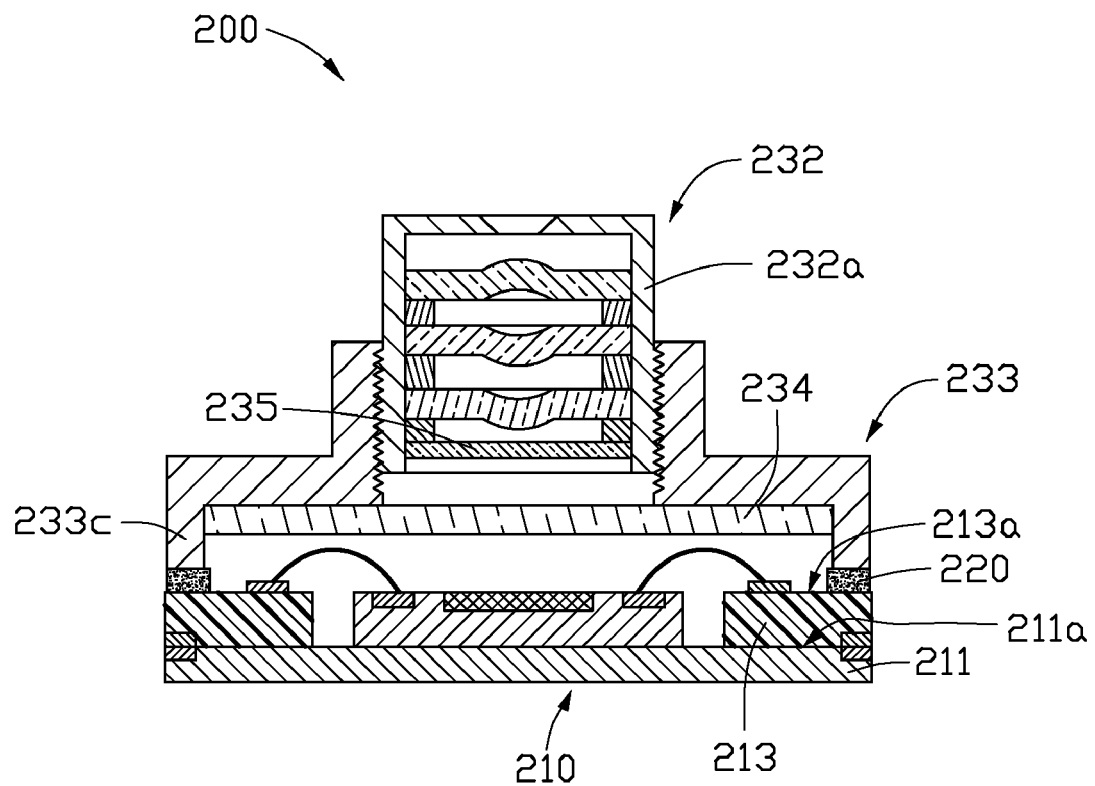
FIG. 2 is a cross section of an image sensing module according to a second embodiment.

FIG. 2 illustrates an image sensing module 200, according to a second embodiment. The image sensing module 200 is similar to the image sensing module 100 of the first embodiment. However, for the image sensing module 200, a width dimension of a pedestal 233c of a lens holder 233 is same as that of both of a supporter 213 and a base substrate 211. An outer periphery of the pedestal 233c is aligned with that of the supporter 113 and the base substrate 211. Furthermore, an adhesive 220 is applied on a peripheral portion (not labeled) of a top surface 213a of the supporter 213 and fixes the supporter 213 to the lens holder 233. Moreover, an infrared-cut filter (IR-cut filter) sheet 235 need not to be coated on a light-pervious plate 234. Instead, the infrared-cut filter sheet 235 is received in a barrel 232a of a lens group 232.

It can be understood that the above-described embodiment are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. An image sensor package comprising:
a base substrate comprising a plurality of base pads;
an image sensor mounted on the base substrate, the image sensor comprising a sensing portion and a plurality of contacts; and
a plurality of wires electrically connecting the base pads to the respective contacts;
wherein the base substrate is comprised of a mixture of carbon nanotubes and alumina, and the carbon nanotubes are in an amount by weight of about 0.5% to about 10% of the base substrate.

2. The image sensor package of claim 1, further comprising a supporter, the supporter comprising a top surface and a plurality of top pads formed on the top surface, and the supporter being mounted on the base substrate with the top surface facing away from the base substrate, the top pads being electrically connected to the base pads of the base substrate.

3. The image sensor package of claim 2, wherein a through hole is defined in the top surface, the image sensor is received in the through hole and mounted on the base substrate.

4. The image sensor package of claim 1, wherein the carbon nanotubes are in an amount by weight of about 1% to about 5% of the base substrate.

5. The image sensor package of claim 1, wherein a thickness of the base substrate is less than 0.2 mm.

6. The image sensor package of claim 5, wherein a thickness of the base substrate is less than 0.15 mm.

7. The image sensor package of claim 1, wherein the base substrate comprises a mounting surface, the image sensor is mounted on the mounting surface of the base substrate, a plurality of recesses is defined in the mounting surface of the base substrate, and the base pads fill the recesses, respectively.

8. An image sensing module comprising:
an image sensor package comprising:
a base substrate comprising a mounting surface and a plurality of base pads formed on the mounting surface,
an image sensor mounted on the base substrate, the image sensor comprising a sensing portion and a plurality of contacts, and
a plurality of wires electrically connecting the base pads to the respective contacts; and a lens module comprising:
a barrel,
at least one lens received in the barrel, and
a lens holder mechanically coupled to the barrel, the lens holder being attached on the mounting surface of the base substrate and receiving the image sensor;
wherein the base substrate is comprised of a mixture of carbon nanotubes and alumina, the carbon nanotubes is in an amount by weight of about 0.5% to about 10% of the base substrate.

9. The image sensing module of claim 8, further comprising an adhesive, the lens holder being attached to the image sensor package via the adhesive.

10. The image sensing module of claim 9, further comprising a supporter, the supporter comprising a top surface and a plurality of top pads formed on the top surface, and the supporter being mounted on the base substrate with the top surface facing away from the base substrate, the top pads being electrically connected to the base pads of the base substrate.

11. The image sensing module of claim 10, wherein the adhesive is applied between the lens holder and the supporter and fixes the lens holder to the supporter.

12. The image sensing module as claim 11, wherein the lens holder comprises a top board, a hole defined in a central portion of the top board, and a pedestal extending downwardly from a peripheral portion of the top board, the top board and the pedestal cooperate to define a receiving space, and the image sensor is received in the receiving space.

13. The image sensing module of claim 12, wherein a dimension of the receiving space is larger than that of an outer periphery of the supporter, the supporter and the image sensor are both received in the receiving space, the adhesive is applied on an outer periphery of the supporter, and the pedestal is attached to the supporter via the adhesive.

14. The image sensing module of claim 12, wherein a dimension of a pedestal is same as that of the supporter, the adhesive is applied on a peripheral portion of a top surface of the supporter, and the pedestal is attached on the top surface of the supporter via the adhesive.

15. The image sensing module of claim 10, wherein a through hole is defined in the top surface of the supporter, the image sensor is received in the through hole and mounted on the mounting surface of the base substrate.

16. The image sensing module of claim 8, wherein the lens module further comprises a light-pervious plate, and the plate is arranged between the barrel and the image sensor for protecting the image sensor.

17. The image sensing module of claim 16, wherein the lens module further comprises a filter, and the filter is arranged between the at least one lens and the plate.

18. The image sensing module of claim 8, wherein a thickness of the base substrate is less than 0.2 mm.

* * * * *